US008779606B2

(12) United States Patent
Yim et al.

(10) Patent No.: US 8,779,606 B2
(45) Date of Patent: Jul. 15, 2014

(54) PACKAGE-ON-PACKAGE ELECTRONIC DEVICES INCLUDING SEALING LAYERS AND RELATED METHODS OF FORMING THE SAME

(71) Applicants: Choongbin Yim, Cheonan-si (KR); Hae-Jung Yu, Seoul (KR); Taesung Park, Cheonan-si (KR)

(72) Inventors: Choongbin Yim, Cheonan-si (KR); Hae-Jung Yu, Seoul (KR); Taesung Park, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/734,393

(22) Filed: Jan. 4, 2013

(65) Prior Publication Data

US 2013/0270685 A1    Oct. 17, 2013

(30) Foreign Application Priority Data

Apr. 13, 2012  (KR) .................. 10-2012-0038268

(51) Int. Cl.
*H01L 23/29* (2006.01)
*H01L 23/02* (2006.01)
*H01L 23/48* (2006.01)
*H01L 23/52* (2006.01)
*H01L 29/40* (2006.01)

(52) U.S. Cl.
USPC ............ 257/790; 257/686; 257/777; 257/778

(58) Field of Classification Search
USPC ......... 257/777, 778, 786, 787, 790, 723, 686, 257/E25.031, E25.032, E23.042, E25.006, 257/E25.013, E25.018, E25.021, E25.027, 257/E21.614, E23.085
See application file for complete search history.

(56) References Cited

U.S. PATENT DOCUMENTS

| 8,658,464 | B2* | 2/2014 | Cheng et al. .................. 438/106 |
| 2010/0304530 | A1 | 12/2010 | Yim et al. |
| 2011/0221075 | A1 | 9/2011 | Meura et al. |
| 2011/0227209 | A1 | 9/2011 | Yoon et al. |
| 2011/0260334 | A1 | 10/2011 | Hasegawa |
| 2011/0304015 | A1* | 12/2011 | Kim et al. ..................... 257/532 |
| 2012/0074586 | A1* | 3/2012 | Seo et al. ...................... 257/774 |
| 2012/0280404 | A1* | 11/2012 | Kwon et al. .................. 257/777 |
| 2013/0112471 | A1* | 5/2013 | Cho et al. ..................... 174/266 |

FOREIGN PATENT DOCUMENTS

| KR | 1020040056437 | 7/2004 |
| KR | 1020070051165 | 5/2007 |
| KR | 1020100129577 | 12/2010 |

* cited by examiner

*Primary Examiner* — Matthew Reames
*Assistant Examiner* — Dilinh Nguyen
(74) *Attorney, Agent, or Firm* — Myers Bigel Sibley & Sajovec, P.A.

(57) ABSTRACT

A package-on-package (POP) electronic device may include first and second packaging substrates, a solder interconnection providing electrical and mechanical coupling between the first and second packaging substrates, and first and second sealing layers between the first and second packaging substrates. The first and second sealing layers may be respective first and second epoxy sealing layers. Moreover, the second epoxy sealing layer may include a solder flux agent, and the first epoxy sealing layer may have a lower concentration of the solder flux agent than the second epoxy sealing layer.

18 Claims, 22 Drawing Sheets

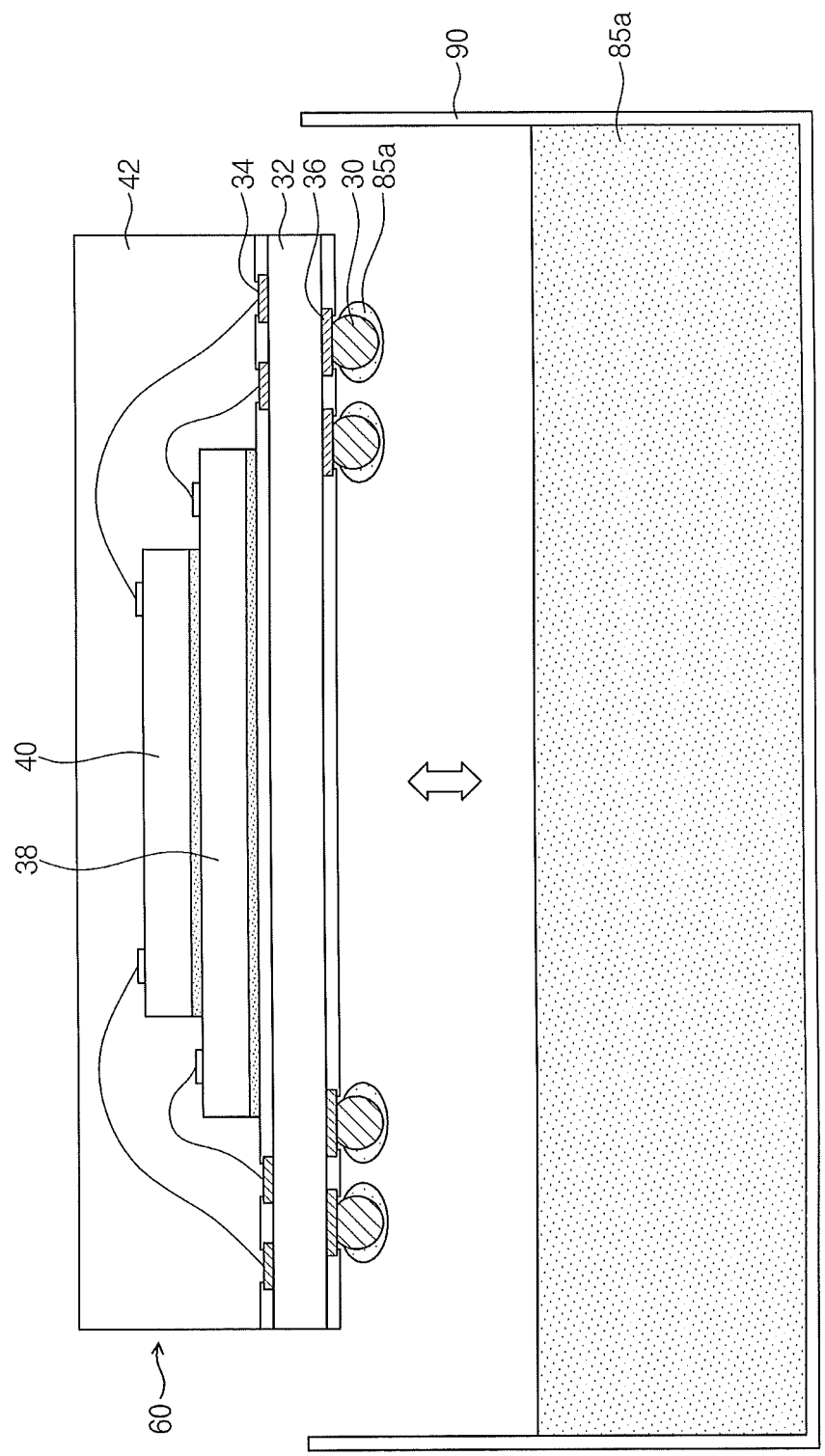

PACKAGE-ON-PACKAGE ELECTRONIC DEVICES INCLUDING SEALING LAYERS AND RELATED METHODS OF FORMING THE SAME

CROSS-REFERENCE TO RELATED APPLICATIONS

This U.S. non-provisional patent application claims priority under 35 U.S.C. §119 to Korean Patent Application No. 10-2012-0038268, filed on Apr. 13, 2012, the entire disclosure of which is hereby incorporated herein by reference.

BACKGROUND

Inventive concepts of the present application relate to package-on-package devices and methods of fabricating the same.

High performance, high speed, and small sizes of electric components have been increasingly demanded with continuing developments of the electronics industry. Responding to these trends, various semiconductor mounting techniques have been suggested. For example, a plurality of semiconductor chips may be mounted on one package substrate or a package may be stacked on a package. For example, a package-on-package (PoP) device may include a plurality of stacked packages with each stacked package including a semiconductor integrated circuit device and a package substrate. Thus, a total thickness of the PoP device may increase. To reduce a total thickness of a PoP device, a thin semiconductor chip may be used in each of the stacked packages. The thin semiconductor chips and/or the stacked packages, however, may warp.

SUMMARY

Embodiments of inventive concepts may provide package-on-package (PoP) devices with reduced warping.

Embodiments of inventive concepts may also provide methods of rapidly and easily fabricating PoP devices with reduced warping.

According to some aspects of inventive concepts, a package-on-package device may include: a lower semiconductor package including a lower package substrate and a lower semiconductor chip mounted on the lower package substrate; an upper semiconductor package including an upper package substrate disposed on the lower semiconductor package and an upper semiconductor package mounted on the upper package substrate; a connecting solder bump connecting the lower package substrate to the upper package substrate; and a sealing layer in contact with the lower semiconductor package and the upper semiconductor package, the sealing layer covering a sidewall of the connecting solder bump. The sealing layer may include epoxy resin and may have flux function.

In some embodiments, the lower semiconductor package may further include a lower molding layer covering a top surface of the lower package substrate and a sidewall of the lower semiconductor chip. The lower molding layer may include a connecting hole in which the connecting solder bump is disposed. A sidewall of the connecting hole may be spaced apart from the sidewall of the connecting solder bump. The sealing layer may fill the connecting hole. A surface roughness of a sidewall of the connecting hole may be greater than a surface roughness of an upper surface of the lower molding layer that is spaced apart from the lower package substrate.

A delamination region may exist between an upper surface of the lower molding layer and the sealing layer.

In other embodiments, the sealing layer may extend to fill a space between the lower semiconductor package and the upper semiconductor package.

In still other embodiments, the sealing layer may include a first sealing layer in contact with a sidewall of the connection solder bump, and a second sealing layer filling a space between the lower semiconductor chip and the upper package substrate. At this time, the second sealing layer may not have a flux function.

In still other embodiments, the lower semiconductor chip may be mounted on the lower package substrate using a flip chip bonding method.

In yet other embodiments, the upper semiconductor chip may be different than the lower semiconductor chip.

According to some other aspects of inventive concepts, a method of fabricating a package-on-package device may include: fabricating a lower semiconductor package including a lower package substrate, a lower semiconductor chip disposed on the lower package substrate, and a lower solder bump disposed on the lower package substrate and spaced apart from the lower semiconductor chip; and fabricating an upper semiconductor package including an upper package substrate, an upper semiconductor chip disposed on the upper package substrate, and an upper solder bump disposed on a bottom surface of the upper package substrate. At least one of the lower solder bump and the upper solder bump may be coated with a sealing layer resin solution. The lower solder bump and the upper solder bump may be melted and bonded to form a connecting solder bump, and a sealing layer. The sealing layer may cover a sidewall of the connecting solder bump, and the sealing layer may be in contact with the upper semiconductor package and the lower semiconductor package.

In some embodiments, the lower semiconductor package may further include a lower mold layer covering a top surface of the lower package substrate and a sidewall of the lower semiconductor chip, and a connecting hole may expose the lower solder bump. At this time, forming the connecting solder bump and the sealing layer may include: dispensing a sealing resin solution in the connecting hole; locating the upper semiconductor package on the lower semiconductor package to dispose the upper solder bump in the connecting hole; and heating the upper solder bump and the lower solder bump.

In other embodiments, coating at least one of the lower solder bump and an upper solder bump with the sealing layer resin solution may include dipping the upper solder bump in the sealing resin solution and/or providing the sealing resin solution on the lower solder bump.

In still other embodiments, the sealing layer resin solution may include epoxy resin and may have a flux function.

According to other aspects of inventive concepts, a package-on-package (POP) electronic device may include first and second packaging substrates. A solder interconnection may provide electrical and mechanical coupling between the first and second packaging substrates, and first and second sealing layers may be provided between the first and second packaging substrates.

According to some other aspects of inventive concepts, a package-on-package (POP) electronic device may include a first packaging substrate and a second packaging substrate on the first packaging substrate. A semiconductor integrated circuit (IC) device may be electrically and mechanically coupled to the first packaging substrate, and the semiconductor IC device may be between the first and second packaging substrates. A solder interconnection may provide electrical and mechanical coupling between the first and second packaging substrates with the solder interconnection being spaced apart from the semiconductor IC device, and a sealing layer may be provided on the solder interconnection between the first and second packaging substrates.

According to still other aspects of inventive concepts, a method of forming a package-on-package (POP) electronic device may include providing a first packaging substrate having a first semiconductor integrated circuit (IC) device electrically and mechanically coupled thereto, and providing a second packaging substrate having a second semiconductor integrated circuit (IC) device electrically and mechanically coupled thereto. A solder interconnection may be provided between the first and second packaging substrates with the first semiconductor IC device between the first and second packaging substrates and spaced apart from the solder interconnection. In addition, a sealing layer may be provided on the solder interconnection.

According to yet other aspects of inventive concepts, a method of forming a package-on-package (POP) electronic device may include providing a mold layer on a first packaging substrate wherein the mold layer includes a via therethrough. A solder interconnection may be provided between the first packaging substrate and a second packaging substrate wherein the solder interconnection extends through the via to provide electrical and mechanical coupling between the first and second packaging substrates. A sealing layer may be provided between the mold layer and the second packaging substrate and/or in the via between the mold layer and the plurality of solder interconnections.

BRIEF DESCRIPTION OF THE DRAWINGS

Inventive concepts will become more apparent in view of the attached drawings and accompanying detailed description.

FIGS. 2 and 3 are cross-sectional views illustrating a method fabricating the PoP device of FIGS. 1A and 1B according to embodiments of inventive concepts;

DETAILED DESCRIPTION OF EMBODIMENTS

Figure 1A:
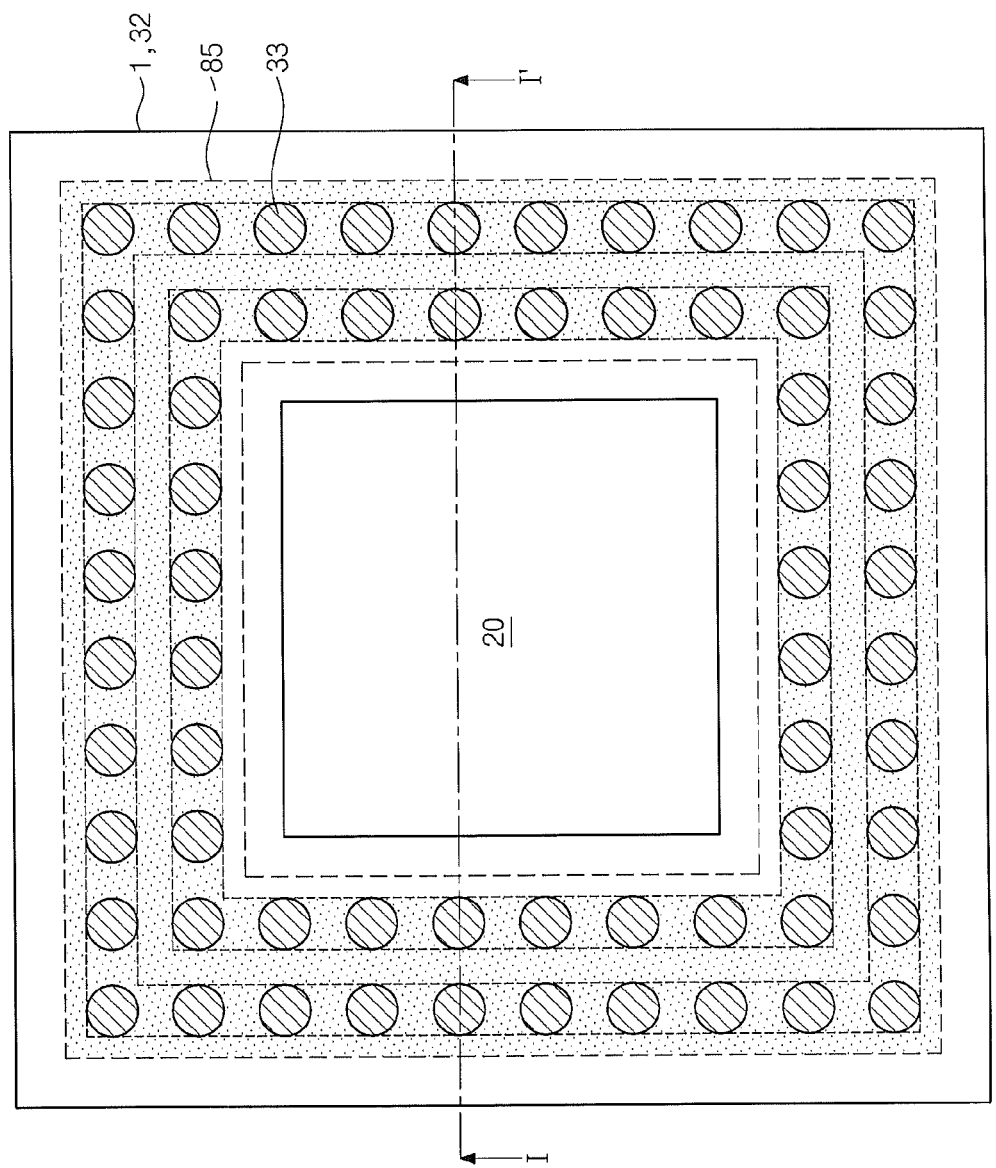
FIG. 1A is a plan view of a package-on-package (PoP) device according to embodiments of inventive concepts.

Inventive concepts will now be described more fully hereinafter with reference to the accompanying drawings, in which examples of embodiments of inventive concepts are shown. Advantages and features of inventive concepts and methods of achieving them will be apparent from the following examples of embodiments that will be described in more detail with reference to the accompanying drawings. It should be noted, however, that inventive concepts are not limited to the following examples of embodiments, and may be implemented in various forms. Accordingly, the examples of embodiments are provided only to disclose inventive concepts and to let those skilled in the art know the category or categories of inventive concepts. In the drawings, embodiments of inventive concepts are not limited to the specific examples provided herein and may be exaggerated for clarity.

The terminology used herein is for the purpose of describing particular embodiments only and is not intended to limit inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description will be described with sectional views as ideal examples of views of inventive concepts. Accordingly, shapes of the examples of views may be modified according to manufacturing techniques and/or allowable errors. Therefore, embodiments of inventive concepts are not limited to specific shapes illustrated in the examples of views, but may include other shapes that may be created according to manufacturing processes. Areas illustrated in the drawings have general properties, and are used to illustrate examples of specific shapes of elements. Thus, these examples should not be construed as limiting the scope of inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of present inventive concepts. Examples of embodiments of aspects of present inventive concepts explained and illustrated herein include their complementary counterparts. The same reference numerals or the same reference designators denote the same or similar elements throughout the specification.

Moreover, examples of embodiments are described herein with reference to cross-sectional illustrations and/or plane illustrations that are idealized examples of illustrations. Accordingly, variations from shapes of the illustrations as a result, for example, of manufacturing techniques and/or tolerances, are to be expected. Thus, examples of embodiments discussed herein should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
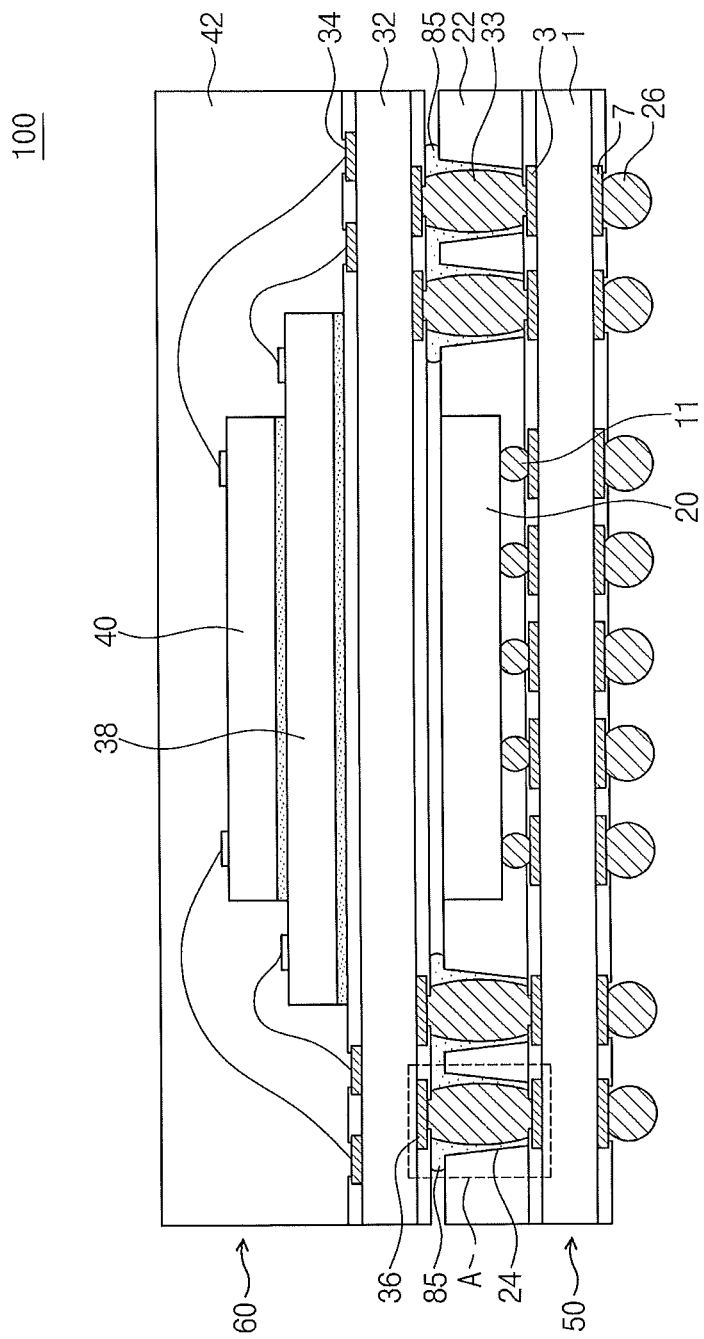
FIG. 1B is a cross-sectional view taken along section line I-I' of FIG. 1A.
Figure 1C:
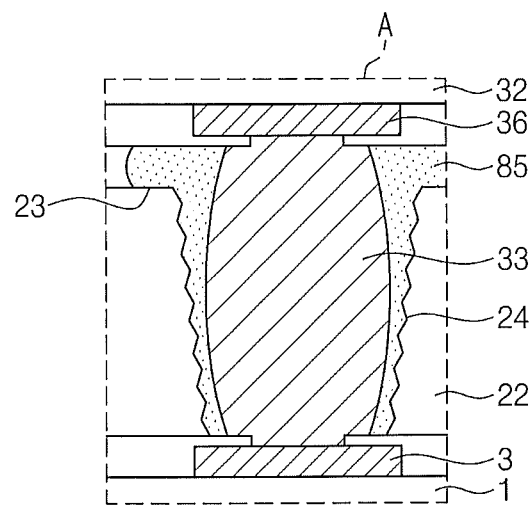
FIGS. 1C and 1D are an enlarged views of a portion 'A' of FIG. 1B.
Figure 1D:
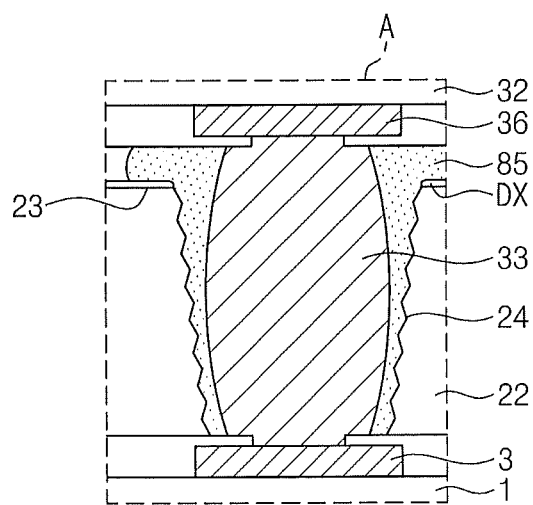

FIG. 1A is a plan view of a package-on-package (PoP) device according to some embodiments of inventive concepts, and FIG. 1B is a cross-sectional view taken along section line I-I' of FIG. 1A. FIGS. 1C and 1D are enlarged views of a portion 'A' of FIG. 1B.

Referring to FIGS. 1A and 1B, a package-on-package (PoP) device 100 according to present embodiments may include a lower semiconductor package 50 and an upper semiconductor package 60.

The lower semiconductor package 50 may include a lower package substrate 1, a lower semiconductor chip 20 mounted on the lower package substrate 1, and a lower mold layer 22 covering the lower package substrate 1 and the lower semiconductor chip 20. First lower pads 3 are disposed on a top surface of the lower package substrate 1, and second lower pads 7 are disposed on a bottom surface of the lower package substrate 1. The first and second lower pads 3 and 7 may be covered by insulating layers. The lower semiconductor chip 20 is electrically connected to the first lower pads 3 through first lower solder bumps 11. The lower semiconductor chip 20 may be mounted on package substrate 1 using a flip chip bonding method. Second lower solder bumps 26 are disposed on the second lower pads 7, respectively. The lower molding layer 22 may cover a sidewall of the lower semiconductor chip 20 and a top surface of the lower semiconductor chip 20 may be exposed. In other words, the top surface of the lower semiconductor chip 20 may not be covered by the lower molding layer 22. The lower molding layer 22 may include connecting hole(s) 24 spaced apart from the lower semiconductor chip 20.

The upper semiconductor package 60 includes an upper package substrate 32, upper semiconductor chips 38 and 40 mounted on the upper package substrate 32, and an upper molding layer 42 covering the upper semiconductor chips 38 and 40 and the upper package substrate 32. The upper semiconductor chips 38 and 40 may be electrically coupled to the upper package substrate 32 by wire bonding. First upper pads 34 are disposed on a top surface of the upper package substrate 32, and second upper pads 36 are disposed on a bottom surface of the upper package substrate 32. Each of the upper and lower molding layers 42 and 22 may include a resin layer and a plurality of filler particles dispersed in the resin layer. The resin layer may include a polymer. The filler particles may include materials such as silica and/or alumina.

The upper semiconductor package 60 is stacked on the lower semiconductor package 50. The upper and lower semiconductor packages 60 and 50 are electrically connected to each other by connecting solder bumps 33 therebetween. Each connecting solder bump 33 is in contact with a respective second upper pad 36 and a respective first lower pad 3. Referring to FIGS. 1C and 1D, each connecting solder bump 33 may be disposed in a respective connecting hole 24 (also referred to as a via). A sidewall of each connecting solder bump 33 may be spaced apart from an inner sidewall of the respective connecting hole 24. A space between the sidewall of the connecting solder bump 33 and the inner sidewall of the connecting hole 24 may be filled with a sealing layer 85. The sealing layer 85 may extend to be in contact with a bottom surface of the upper semiconductor package 60 and a top surface of the lower semiconductor package 50 simultaneously. A surface roughness of sidewalls of connecting hole 24 may be greater than a surface roughness of an upper surface 23 of the lower molding layer 22 that is spaced apart from the lower package substrate 1. Because a surface area of the connecting hole 24 sidewalls may be increased due to the increased surface roughness, an adhesive force between the sealing layer 85 and the sidewall of the connecting hole 24 may be increased. As shown in FIG. 1C, the sealing layer 85 may be in direct contact with an upper surface 23 of the lower molding layer 22. As shown in FIG. 1D, a delamination region DX may exist between the sealing layer 85 and the upper surface 23 of the lower molding layer 22.

The sealing layer 85 may include epoxy resin. For example, the epoxy resin may be a bisphenol F type epoxy resin. Moreover, the sealing layer may have a flux function. The epoxy resin may have a flux function, for example, so that the sealing layer 85 has the flux function. Alternatively, another constituent part included in the sealing layer 85 may have a flux function. For example, the sealing layer 85 may further include a hardener to harden the epoxy resin and the hardener may have the flux function. For example, the hardener having the flux function may include phenol resin, phenolic carboxylic acid, acid anhydride, carboxylic acid, and/or aromatic hydrazide. In other embodiments, the sealing layer 85 may further include an additional flux constituent part having the flux function. For example, the flux constituent part may include carboxylic acid, phenol compound containing sulfur, rosin, derivatives of rosin, and/or synthetic resin. The sealing layer 85 may further include a mineral-filler such as silica.

Because the sealing layer 85 surrounds sidewalls of the connecting solder bump 85 and is in contact with both the upper semiconductor package 60 and the lower semiconductor package 50, cracking of the connecting solder bump(s) 85 may be reduced and/or prevented, and the connecting solder bump(s) 85 may be protected. For example, joint cracks between the upper semiconductor package 60 and the lower semiconductor package 50 may be reduced. In addition, a contact area between the upper semiconductor package 60 and the lower semiconductor package 50 may increase due to the sealing layer 85 (or a non-contact region of the upper and lower semiconductor packages 60 and 50 may decrease), such that a degree of warping of the entire PoP device 100 may be reduced. Additionally, the connecting solder bump 33, the upper semiconductor package 60, and/or the lower semiconductor package 50 may be protected from moisture, external contamination, and/or corrosion due to the sealing layer 85.

Figure 3:
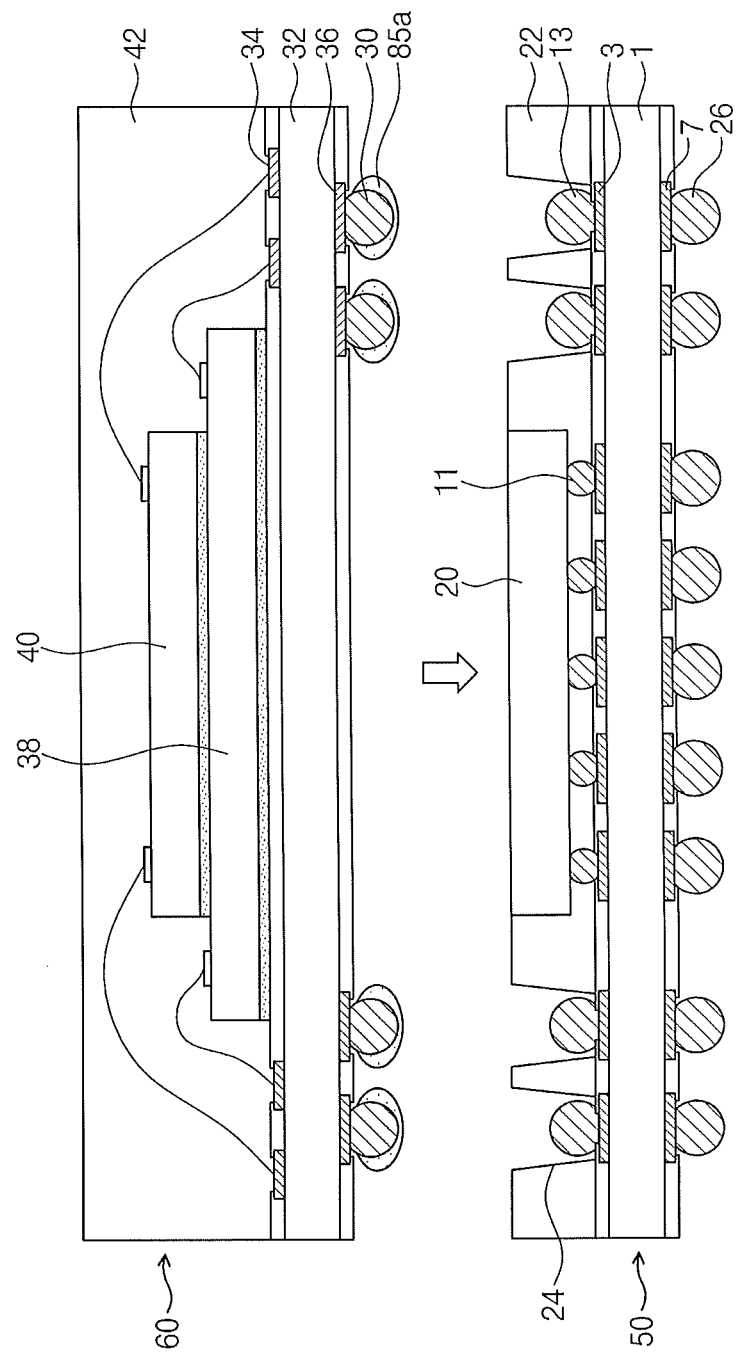

FIGS. 2 and 3 are cross-sectional views illustrating a method fabricating the PoP device of FIGS. 1A and 1B according to some embodiments of inventive concepts.

Referring to FIG. 2, a container 90 including a sealing layer resin solution 85a therein may be prepared. The sealing layer resin solution 85a may include epoxy resin and may have a flux function. For example, the epoxy resin may include a bisphenol F type epoxy resin. The epoxy resin may have the flux function so that the sealing layer resin solution 85a has the flux function. Alternatively, another constituent part included in the sealing layer resin solution 85a may provide the flux function. For example, the sealing layer resin solution 85a may further include a hardener to harden the epoxy resin, and the hardener may provide the flux function. For example, the hardener having the flux function may include phenol resin, phenolic carboxylic acid, acid anhydride, carboxylic acid, and/or aromatic hydrazide. In other embodiments, the sealing layer resin solution 85a may further include an additional flux constituent part providing the flux function. For example, the flux constituent part may include carboxylic acid, a phenol compound containing sulfur, rosin, derivatives of rosin, and/or synthetic resin. The sealing layer resin solution 85a may further include a mineral-filler such as silica. The sealing layer resin solution 85a may further include a solvent to dissolve/disperse the epoxy resin, the hardener, and/or the flux constituent part.

An upper semiconductor package 60 is located over the container 90. As described with reference to FIG. 1A, the upper semiconductor package 60 includes an upper package substrate 32, upper semiconductor chips 38 and 40 mounted on the upper package substrate 32, and an upper molding layer 42 covering the upper package substrate 32 and the upper semiconductor chips 38 and 40, first upper pads 34, and second upper pads 36. In addition, upper solder bumps 30 are adhered to respective second upper pads 36. The upper semiconductor 60 is lowered, so that the sealing layer resin solution 85a may be substantially coated on only a surface of the upper solder bump 30.

Referring to FIG. 3, the upper semiconductor package 60 is located on a lower semiconductor package 50. As described with reference to FIG. 1A, the lower semiconductor package 50 may include a lower package substrate 1, a lower semiconductor chip 20 mounted on the lower package substrate 1, a lower molding layer 22 covering the lower package substrate 1 and the lower semiconductor chip 20, first lower pads 3, second lower pads 7, first lower solder bumps 11, and second lower solder bumps 26. Additionally, the lower semiconductor package 50 may further include third lower solder bumps 13 disposed on first lower pads 3 spaced apart from the first lower solder bumps 11. Third lower solder bumps 13 may be exposed in respective connecting holes 24. Connecting holes 24 may be formed by laser drilling the lower molding layer 22. Accordingly, a surface roughness of sidewalls of each connecting hole 24 may be greater than a surface roughness of an upper surface of the lower molding layer 22 spaced apart from the lower package substrate 1 due to laser drilling. When the upper semiconductor package 60 is located over the lower semiconductor package 50, the upper solder bumps 30 coated with the sealing layer resin solution 85a are aligned in the connecting holes 24 to meet respective third lower solder bumps 13. Connecting holes 24 may function as containers preventing/reducing flow of the sealing layer resin solution 85a to the outside. Additionally, the connecting holes 24 may fix the location of the upper semiconductor package 60.

Referring again to FIGS. 1A, 1B, and 1C, the upper solder bumps 30 and the third lower solder bumps 13 are heated at a temperature equal to or greater than melting points of the upper solder bumps 30 and the third lower solder bumps 13. At this time, an oxide layer on surfaces of the upper solder bumps 30 and the third lower solder bumps 13 may be removed/reduced and a surface tension for soldering may be reduced due to a flux constituent part included in a sealing layer resin solution 85a in the connecting hole 24 and/or a flux function of a sealing layer resin solution 85a. Thus, the upper solder bumps 30 and the third lower solder bumps 13 may be melted and bonded (in a reflow operation) to each other to form connecting solder bumps 33 as illustrated in FIG. 1B. In this process, the epoxy resin included in the sealing layer resin solution 85a may be hardened and the solvent in the sealing layer resin solution 85a may be removed. Thus, the sealing layer resin solution 85a may be formed into a sealing layer 85.

Figure 4:
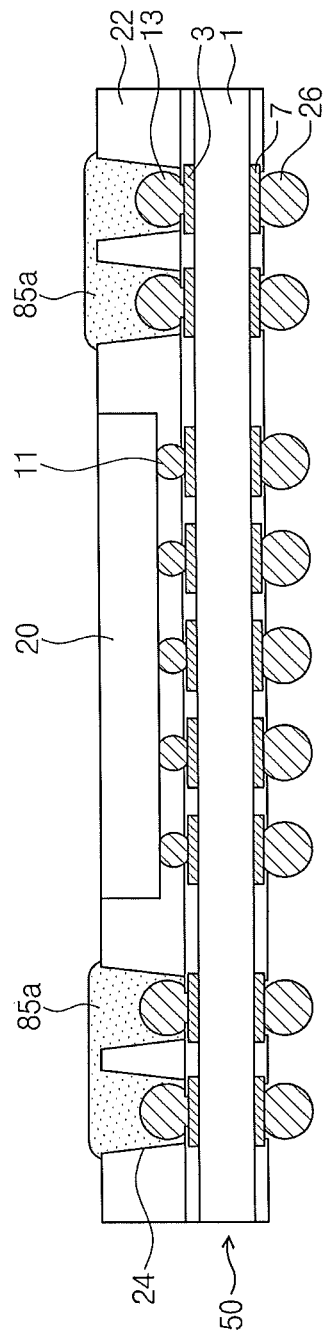
FIGS. 4 and 5 are cross-sectional views illustrating a method fabricating the PoP device of FIGS. 1A and 1B according to other embodiments of inventive concepts.
Figure 5:
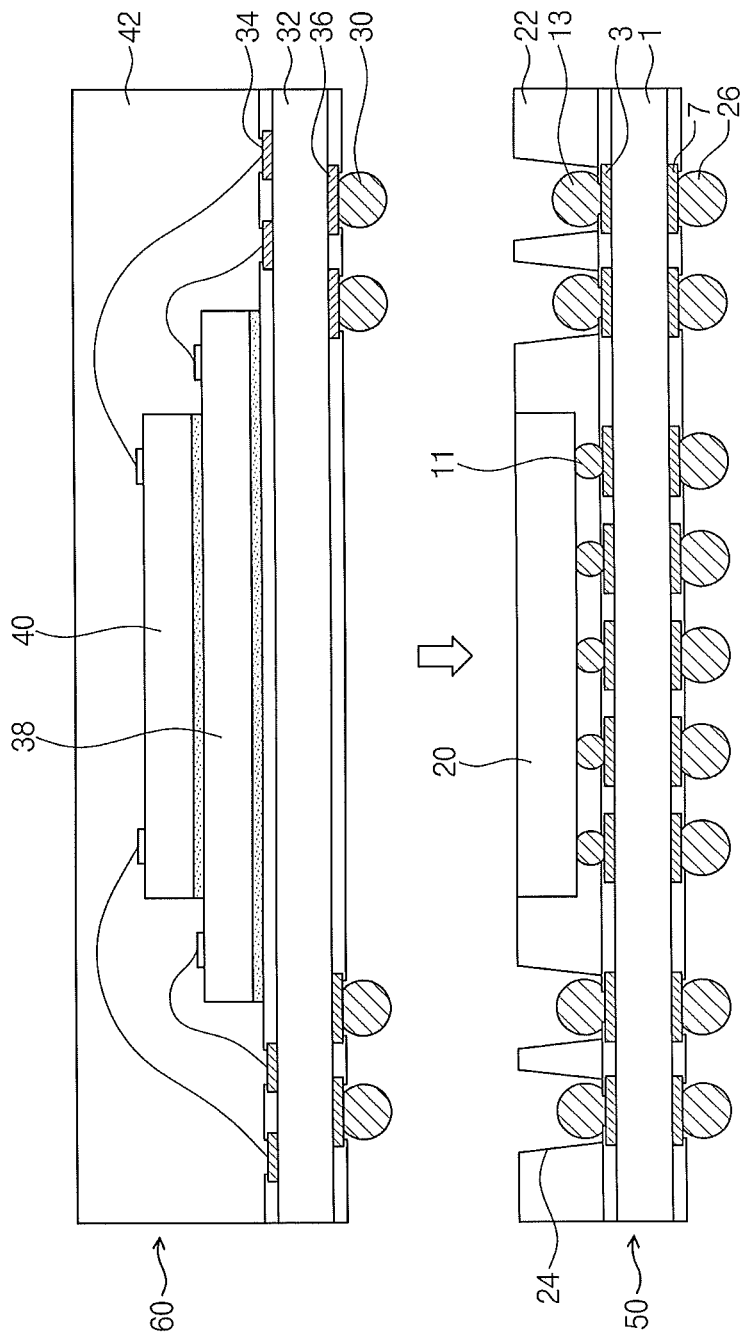

FIGS. 4 and 5 are cross-sectional views illustrating a method fabricating the PoP device of FIGS. 1A and 1B according to other embodiments of inventive concepts.

Referring to FIG. 4, a sealing layer resin solution 85a may be coated on a lower semiconductor package 50. At this time, the sealing resin solution 85a may be selectively coated to be disposed in the connecting holes 24. The connecting holes 24 may function as containers preventing/reducing flow of the sealing layer resin solution 85a to the outside.

Referring to FIG. 5, an upper semiconductor package 60 is located on the lower semiconductor package 50, so that the upper solder bumps 30 are aligned in respective connecting holes 24 with the sealing layer resin solution 85a. Thus, the upper solder bumps 30 meet the third lower solder bumps 13.

Subsequently, as described above, a heating process is performed (in a reflow operation) to form a connecting solder bump 33 and a sealing layer 85.

In the method of fabricating the PoP device described with reference to FIG. 3 or 5, at least one of the third lower solder bumps 13 and/or the upper solder bumps 30 may be coated with the sealing layer resin solution 85a having the flux function and then heated. Thus, the connecting solder bump 33 and the sealing layer 85 may be formed relatively simply and rapidly.

Figure 6:
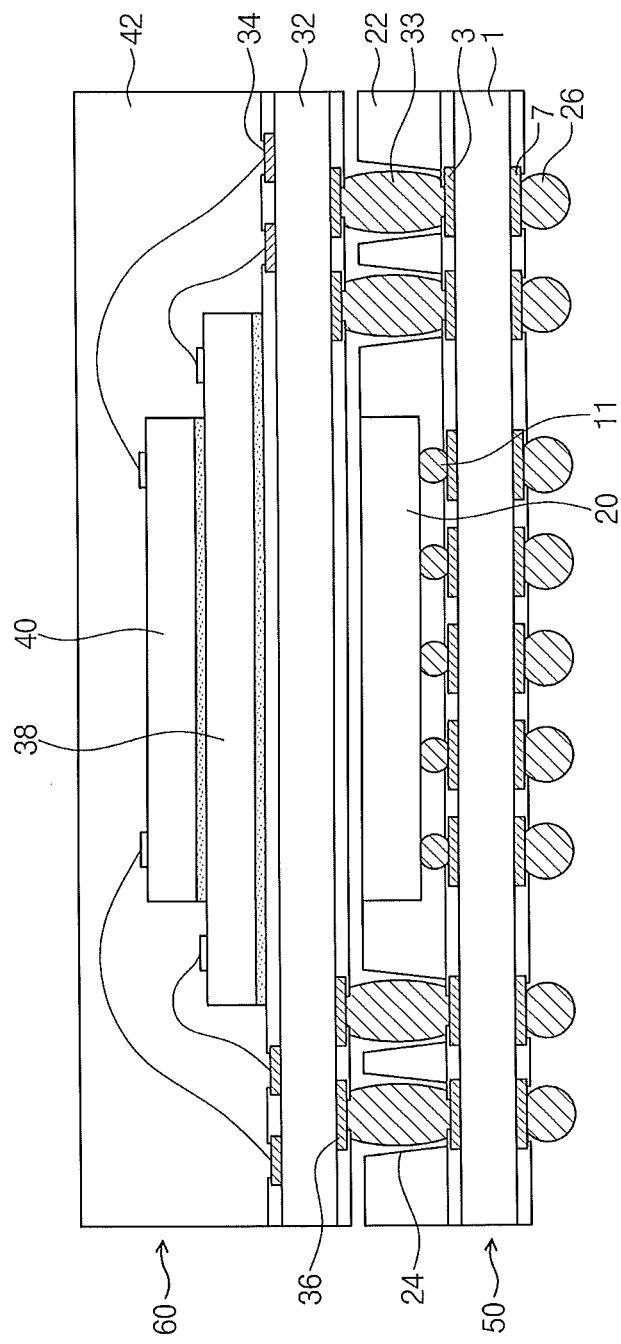
FIG. 6 is a cross-sectional view illustrating a method fabricating the PoP device of FIGS. 1A and 1B according to still other embodiments of inventive concepts.

Other methods of fabricating the PoP device of FIGS. 1A and 1B may be different from the methods described above. FIG. 6 is a cross-sectional view illustrating a method fabricating the PoP device of FIGS. 1A and 1B according to still other embodiments of inventive concepts.

Referring to FIG. 6, an upper semiconductor package 60 is located on the lower semiconductor package 50. A solution having only the flux function without epoxy resin is coated on upper and/or lower solder bumps 30 and/or 13 and then heated to form connecting solder bumps 33. Thereafter, a sealing layer resin solution including epoxy resin may be provided between the upper semiconductor package 60 and the lower semiconductor package 50, and then the sealing layer resin solution may be hardened to form a sealing layer 85.

Figure 7A:
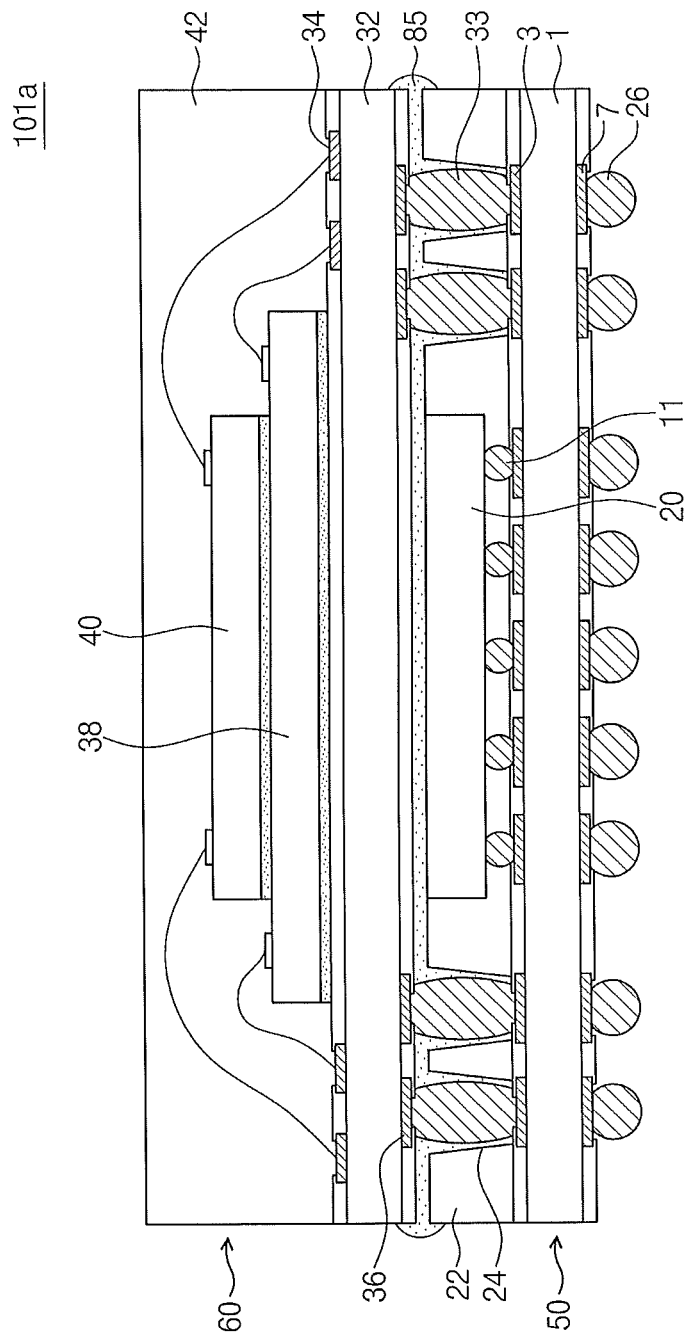
FIGS. 7A, 7B, and 7C are cross-sectional views illustrating PoP devices according to other embodiments of inventive concepts.
Figure 7B:
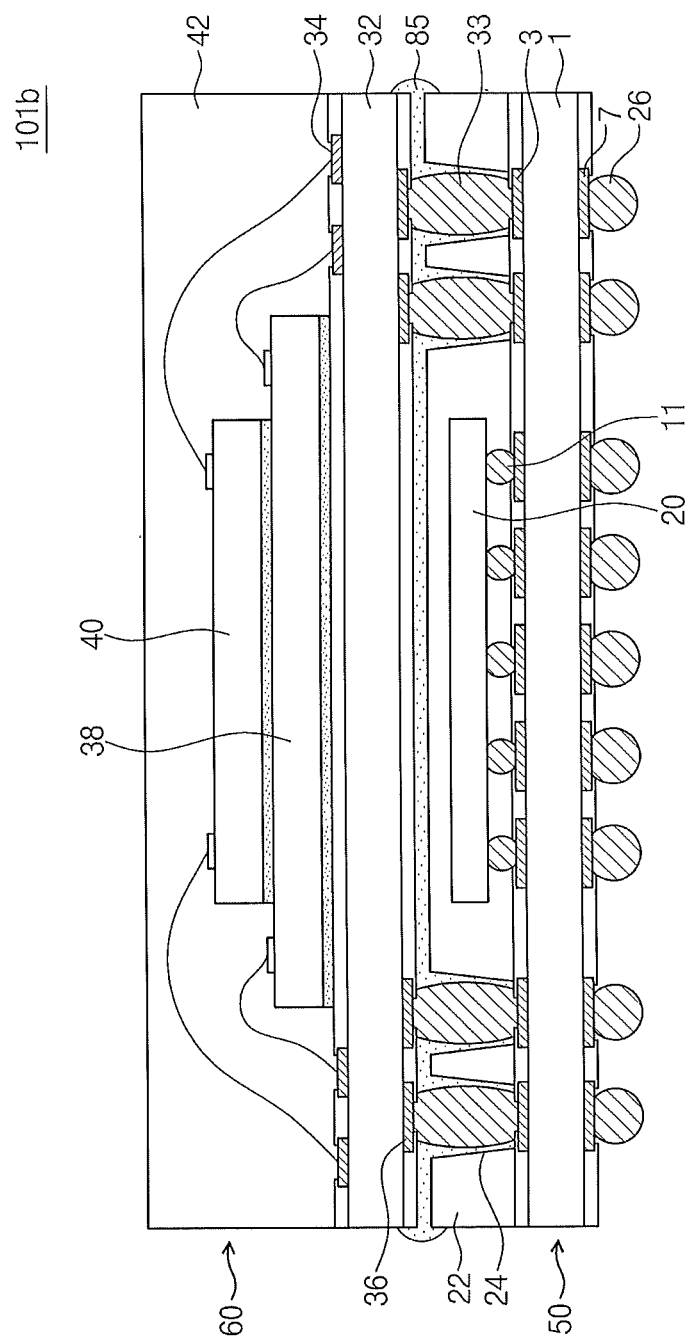
Figure 7C:
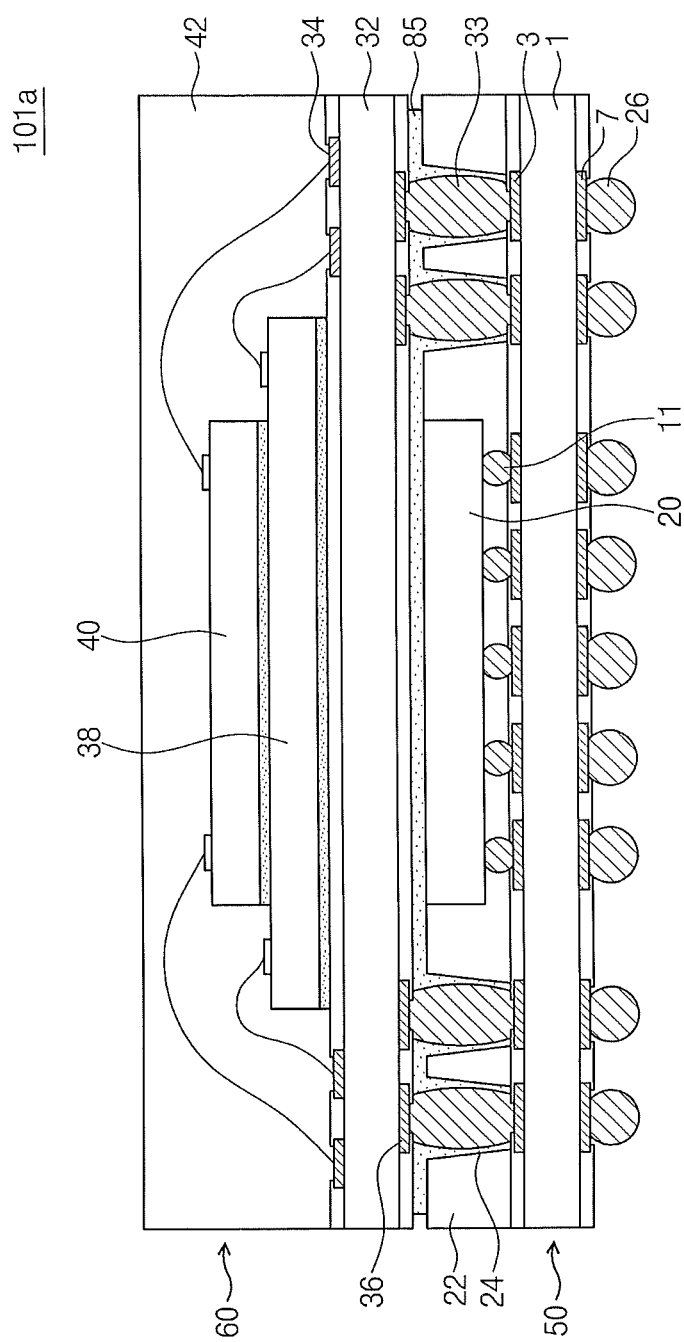

FIGS. 7A, 7B, and 7C are cross-sectional views illustrating PoP devices according to other embodiments of inventive concepts.

Referring to FIG. 7A, in a PoP device 101a according to present embodiments, the sealing layer 85 of FIG. 1A extends to fill an entire space between the upper semiconductor package 60 and the lower semiconductor package 50. As shown in FIG. 7A, the sealing layer 85 may protrude outside a space between the upper and lower semiconductor packages 60 and 50. Other elements of the PoP device 101a may be the same as corresponding elements shown in FIG. 1B. The sealing layer 85 in FIG. 7A may be in contact with a top surface of the lower semiconductor chip 20. Thus, a degree of warping of the PoP device 101a may be further reduced.

Referring to FIG. 7B, in a PoP device 101b according to present embodiments, a lower molding layer 22 may cover a top surface of the lower semiconductor chip 20. Other elements of the PoP device 101b may be the same as corresponding elements in FIG. 7A. The sealing layer 85 may be in contact with a top surface lower molding layer 22.

Referring to FIG. 7C, a PoP device 101c according to present embodiments may have a structure similar to that of FIG. 7A. In FIG. 7C, however, the sealing layer 85 may be confined within a space between the upper and lower semiconductor packages 60 and 50. Accordingly, the sealing layer 85 of FIG. 7C does not protrude outside the space between the upper and lower semiconductor packages 60 and 50. Other elements of FIG. 7C may be the same as those discussed above with respect to FIG. 7A.

Figure 8:
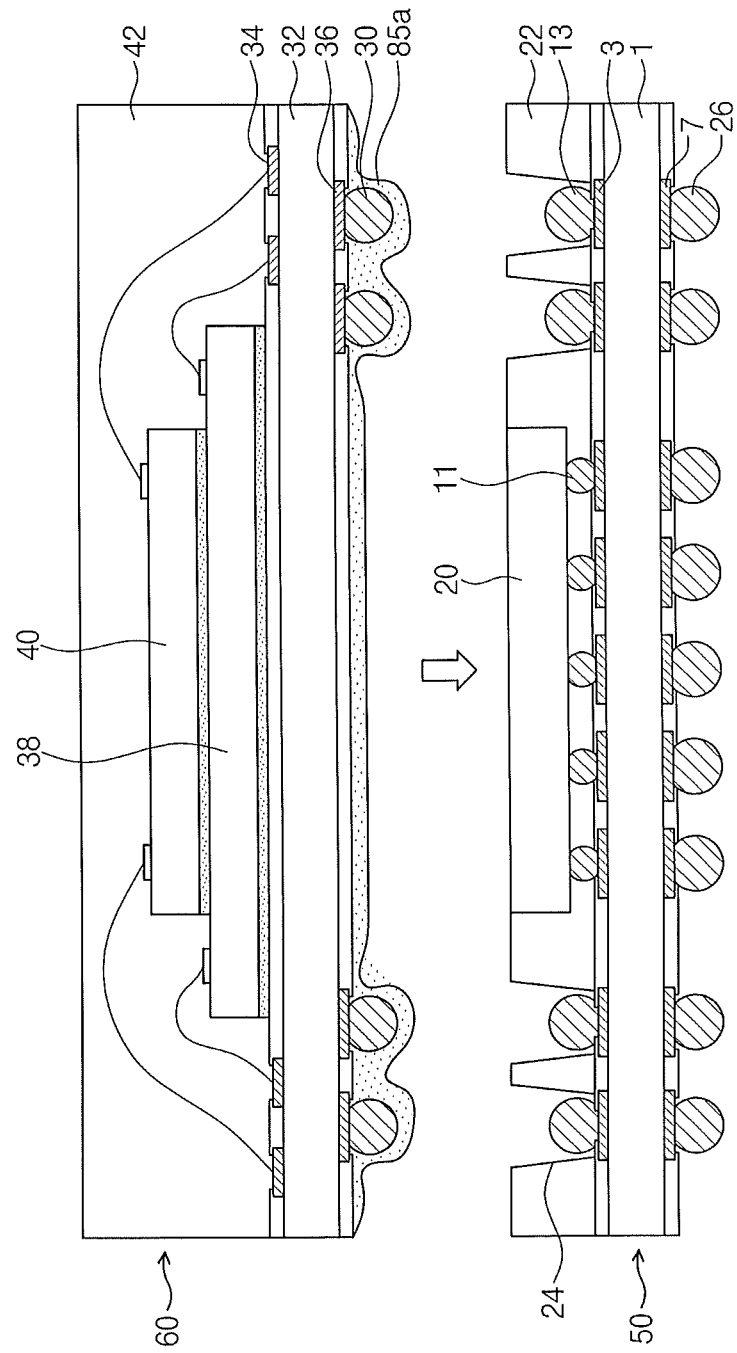
FIG. 8 is a cross-sectional view illustrating a method fabricating the PoP device of FIG. 7A according to embodiments of inventive concepts.

FIG. 8 is a cross-sectional view illustrating a method of fabricating the PoP device of FIG. 7A according to embodiments of inventive concepts.

Referring to FIG. 8, as described with reference to FIG. 2, a lower portion of the upper semiconductor package 60 is dipped in the sealing layer resin solution 85a. In FIG. 8, the sealing layer resin solution 85a is coated on an entire bottom surface of the upper semiconductor package 60. Thereafter, the upper semiconductor package 60 is located on the lower semiconductor package 50, and then the upper and lower semiconductor packages 60 and 50 are heated (in a reflow operation) to form the PoP device 101a as shown in FIG. 7A.

Figure 9:
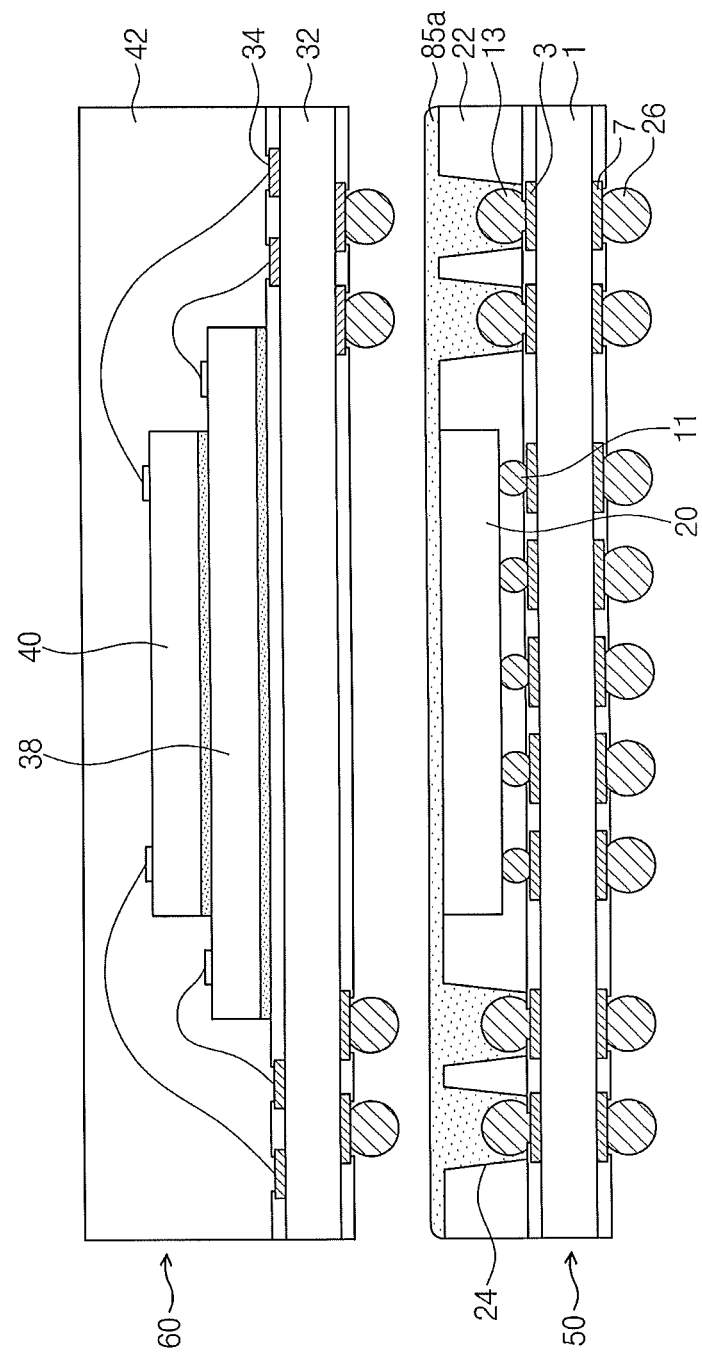
FIG. 9 is a cross-sectional view illustrating a method of fabricating the PoP device of FIG. 7A according to other embodiments of inventive concepts.

FIG. 9 is a cross-sectional view illustrating a method of fabricating the PoP device of FIG. 7A according to other embodiments of inventive concepts.

Referring to FIG. 9, the sealing layer resin solution 85a is coated on an entire surface of the lower semiconductor package 50. Thereafter, the upper semiconductor package 60 is located on the lower semiconductor package 50, and then the upper and lower semiconductor packages 60 and 50 are heated (in a reflow operation) to form the PoP device 101a of FIG. 7A.

FIGS. 10 to 13 are cross-sectional views illustrating PoP devices according to still other embodiments of inventive concepts.

Figure 10:
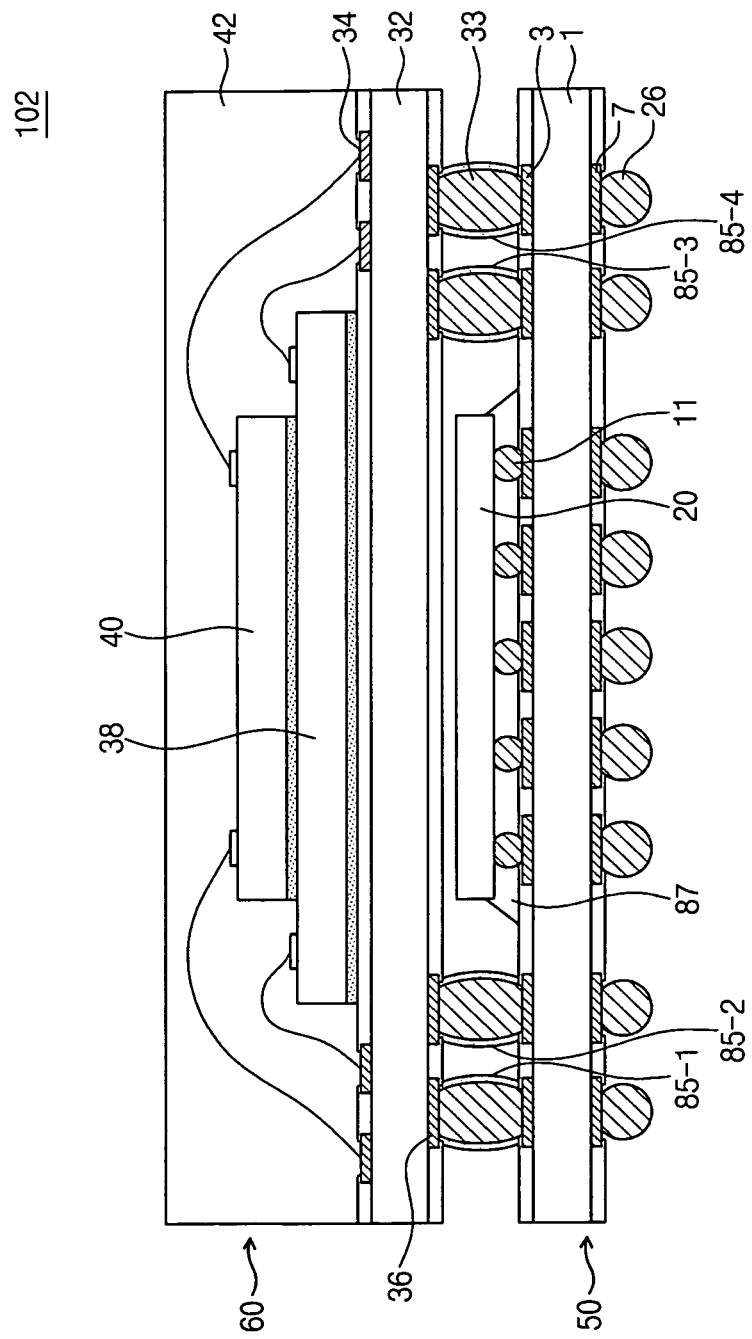
FIGS. 10 to 13 are cross-sectional views illustrating PoP devices according to still other embodiments of inventive concepts.

Referring to FIG. 10, a lower semiconductor package 50 may not include a lower molding layer 22 in a PoP device 102 according to present embodiments. Sidewalls of connecting solder bumps 33 may be covered by a sealing layer(s) 85-1, 85-1, 85-3, and 85-4. Additionally, the sealing layer(s) 85-1, 85-1, 85-3, and 85-4 may extend to be in contact with the lower semiconductor package 50 and an upper semiconductor package 60 simultaneously. At this time, a space between a lower semiconductor chip 20 and a lower package substrate 1 may be filled with an underfill resin layer 87. The underfill resin layer 87 may have a composition that is the same as and/or similar to the sealing layer(s) 85-1, 85-1, 85-3, and 85-4. Other elements of the PoP device 102 may be the same as and/or similar to corresponding elements of FIG. 1A. A method of fabricating the PoP device 102 of FIG. 10 may be similar to the method described with reference to FIG. 3.

Figure 11:
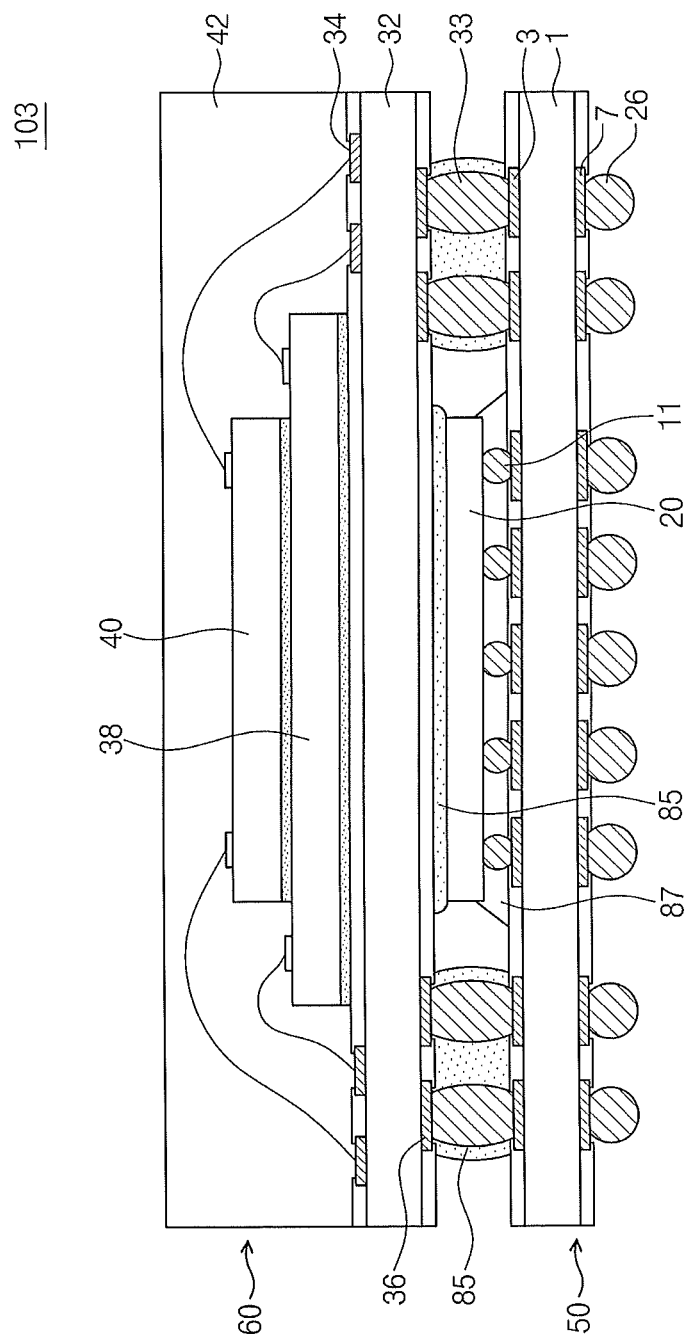

Referring to FIG. 11, in a PoP device 103 according to present embodiments, a sealing layer 85 may cover sidewalls of two (or more) adjacent connecting solder bumps 33 and fill a space between the two (or more) adjacent connecting solder bumps 33. Additionally, the sealing layer 85 may be disposed between a lower semiconductor chip 20 and an upper package substrate 32. Other elements of the PoP device 103 may be the same as and/or similar to corresponding elements of FIG. 10. A method of fabricating the PoP device 103 of FIG. 11 may be similar to the method described with reference to FIG. 5.

Figure 12:
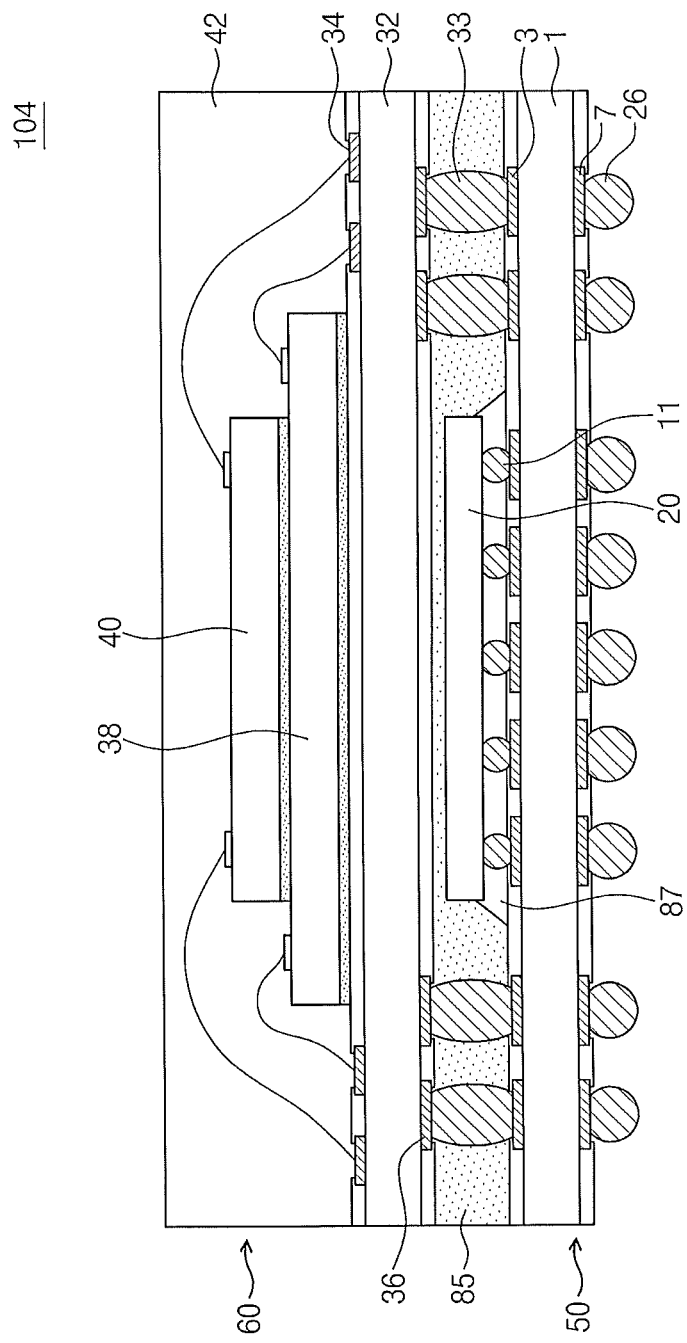

Referring to FIG. 12, in a PoP device 104 according to present embodiments, an entire space between a lower semiconductor package 50 and an upper semiconductor package 60 may be filled with a sealing layer 85. Other elements of the PoP device 104 may be the same as and/or similar to corresponding elements of FIG. 11. A method of fabricating the PoP device 104 of FIG. 12 may be similar to the method described with reference to FIG. 5.

Figure 13:
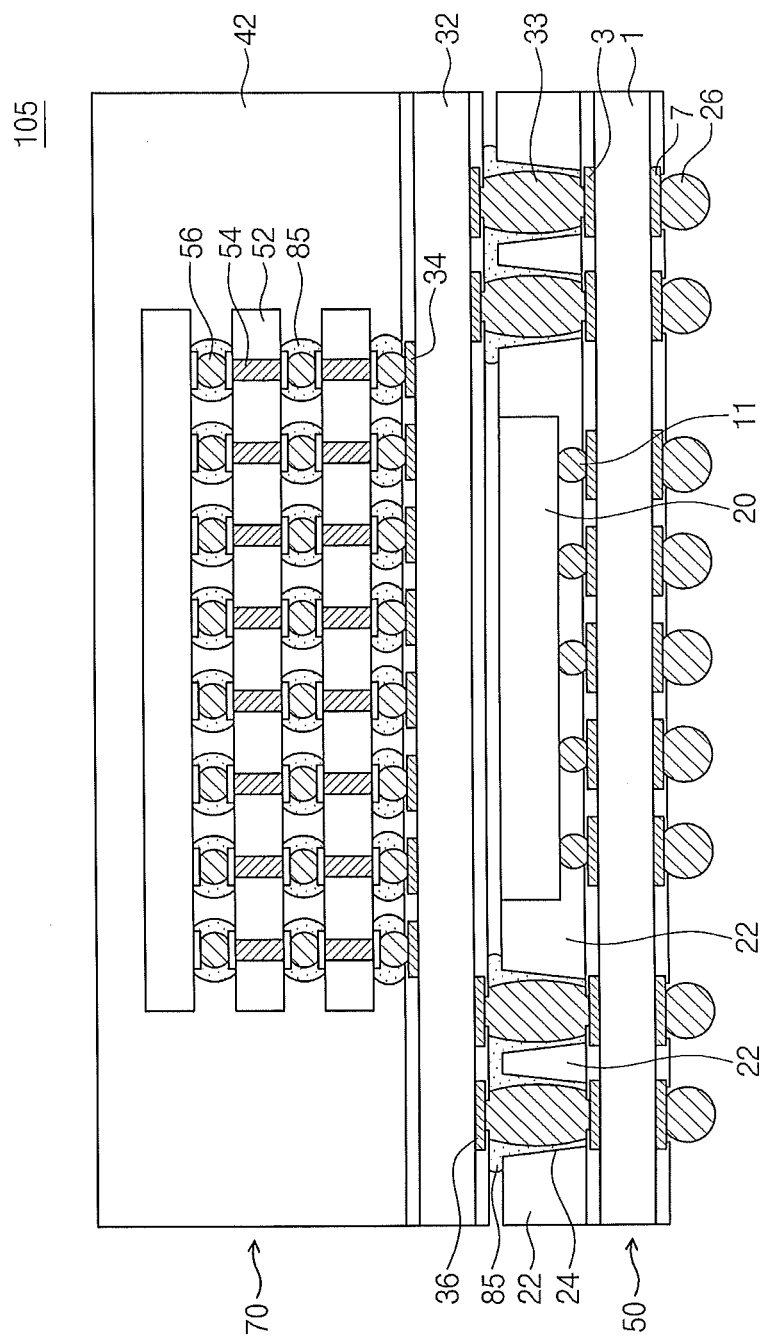

Referring to FIG. 13, a PoP device 105 according to present embodiments includes a lower semiconductor package 50 and an upper semiconductor package 70. The upper semiconductor package 70 may include an upper package substrate 32 and a plurality of upper semiconductor chips 52. The plurality of semiconductor chips 52 may be stacked and mounted on the upper package substrate 32 through upper inside solder bumps 56 using a flip chip bonding method. Upper semiconductor chips 52 may include through vias 54 overlapping upper inside solder bumps 56 and disposed in upper semiconductor chips 52. Sidewalls of upper inside solder bumps 56 may also be covered by the upper molding layer 42. Other elements of the PoP device 105 may be the same as and/or similar to corresponding elements of FIG. 1B.

Figure 14A:
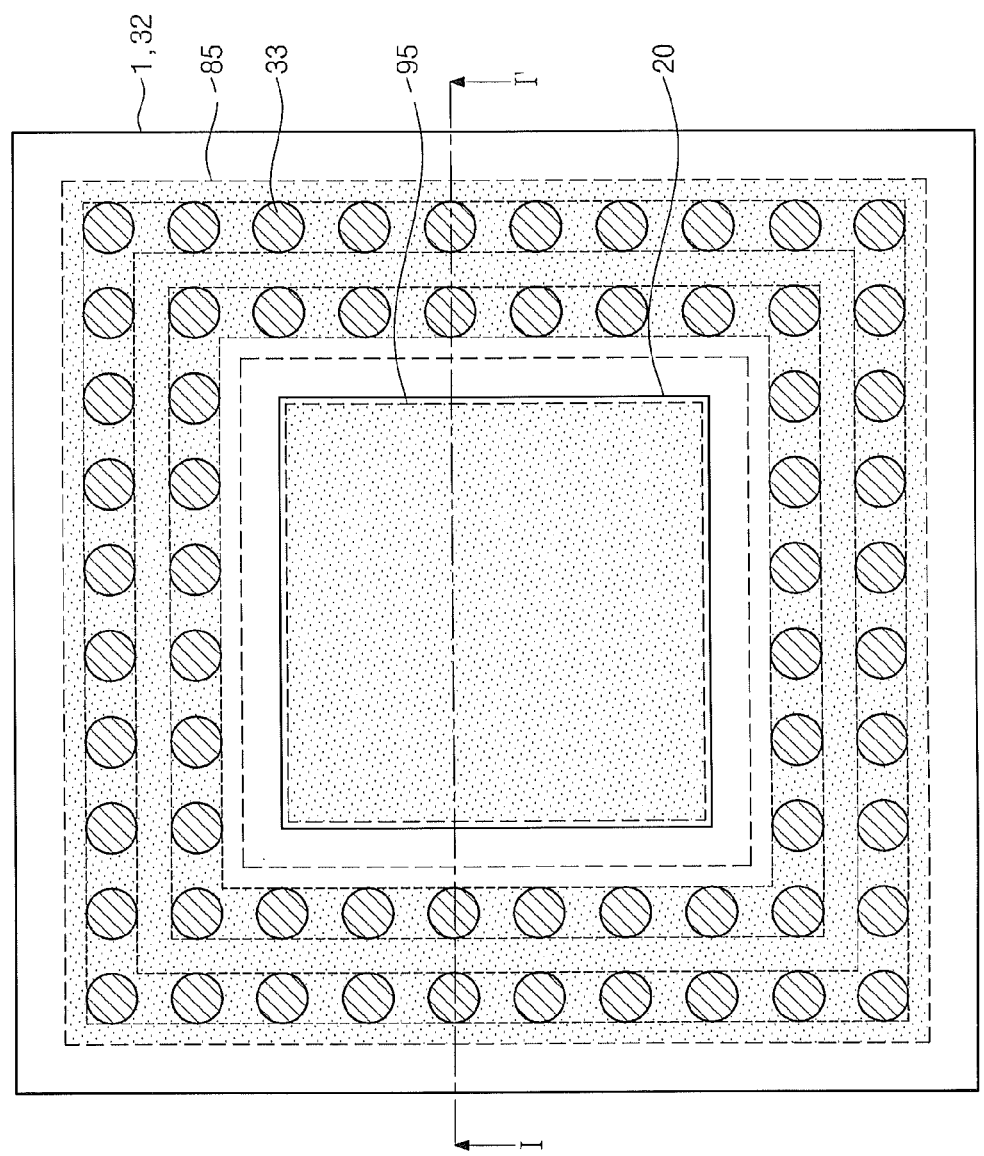
FIG. 14A is a plan view of a package-on-package (PoP) device according to other embodiments of inventive concepts.
Figure 14B:
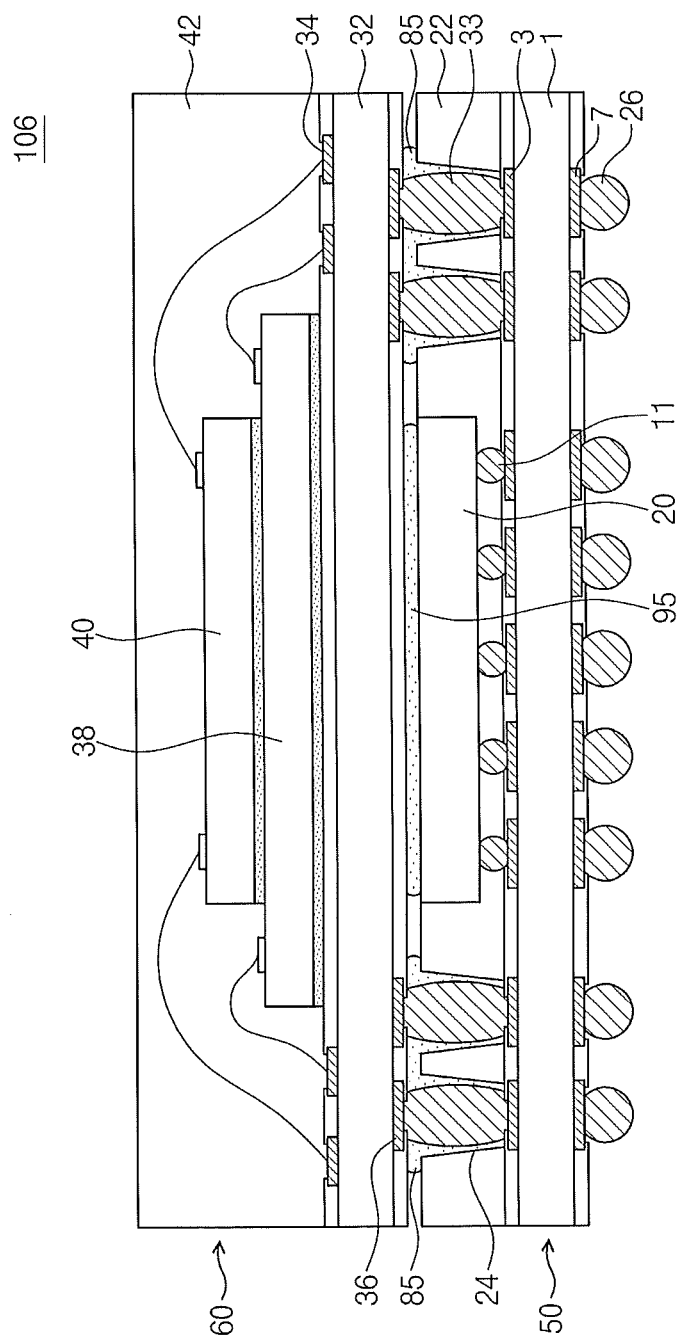
FIG. 14B is a cross-sectional view taken along section line I-I' of FIG. 14A.

FIG. 14A is a plan view of a package-on-package (PoP) device according to other embodiments of inventive concepts, and FIG. 14B is a cross-sectional view taken along section line I-I' of FIG. 14A.

Referring to FIGS. 14A and 14B, a PoP device 106 may include a first sealing layer 85 covering sidewalls of connecting solder bumps 33 and a second sealing layer 95 filling a space between a lower semiconductor chip 20 and an upper package substrate 32. The first sealing layer 85 may be the same as the sealing layer 85 discussed above with reference to FIG. 1B. The second sealing layer 95 may include epoxy resin, but may exclude a flux function. Because the second sealing layer 85 does not provide a flux function, an increased adhesive force may be provided between the second sealing layer 95 and the lower semiconductor chip 20 and/or between the second sealing layer 95 and the upper package substrate 32.

The PoP device 106 of FIGS. 14A and 14B may be formed using the following operations. First, a sealing layer resin solution 85a (with or without a flux function) may be provided in the connecting holes 24. Another sealing layer resin solution (without a flux function) may be coated on the lower semiconductor chip 20. Then, the upper semiconductor package 60 may be located on the lower semiconductor package 50 and heated to form connecting solder bumps 33 and first and second sealing layers 85 and 95. Other elements and/or operations may be the same as or similar to elements/operations discussed above with respect to FIG. 1B.

Semiconductor package techniques described above may be applied to various kinds of semiconductor devices and package modules including various kinds of semiconductor devices.

Figure 15:
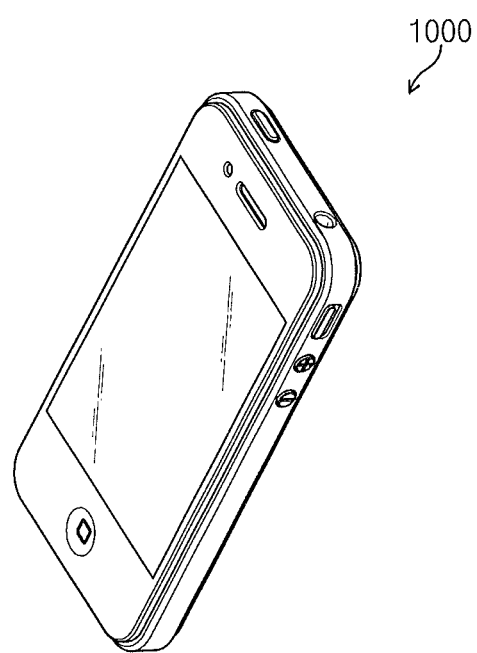
FIG. 15 is a perspective view illustrating an electronic device including at least one semiconductor package according to embodiments of inventive concepts.

FIG. 15 is a perspective view illustrating an electronic device including at least one semiconductor package according to embodiments of inventive concepts discussed above.

Referring to FIG. 15, PoP devices according to embodiments of inventive concepts may be applied to an electronic device 1000 such as a smart phone. Since PoP devices according to embodiments described above may provide improved characteristics in size reduction and/or performance, PoP devices may provide advantages of reduced weight, reduced thickness, reduced length/width, and/or reduced size of the electronic device 1000 performing various other functions simultaneously. The electronic device 1000 is not limited to the smart phone illustrated in FIG. 15. In other embodiments, the electronic device 1000 may be realized as various electronic devices such as a mobile electronic device, a laptop computer, a portable computer, a portable multimedia player (PMP), a MP3 player, a camcorder, a web tablet, a wireless phone, a navigation device, and/or a personal digital assistant (PDA).

Figure 16:
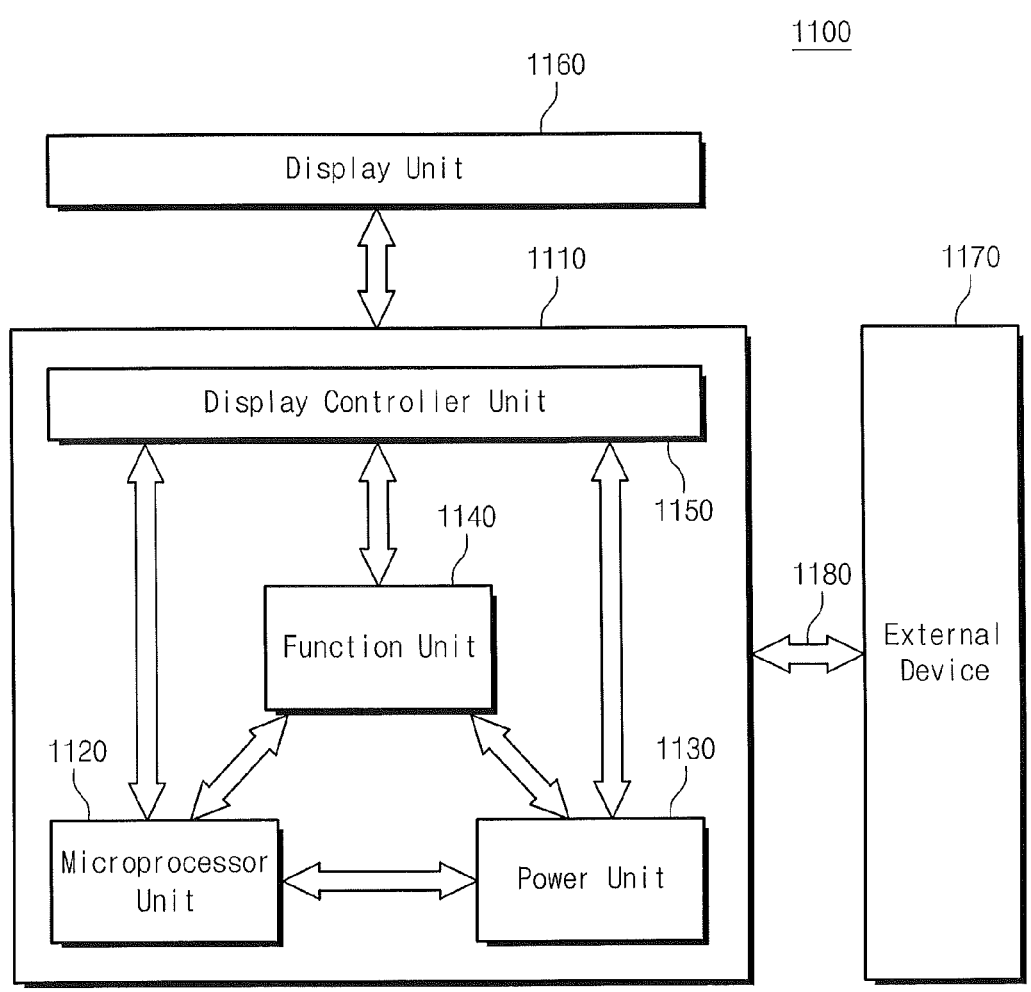
FIG. 16 is a system block diagram illustrating an electronic device including at least one semiconductor package according to embodiments of inventive concepts.

FIG. 16 is a system block diagram illustrating an electronic device including at least one semiconductor package according to embodiments of inventive concepts discussed above.

Referring to FIG. 16, one or more of PoP devices 100 to 106 may be applied to an electronic device 1100 according to other embodiments. The electronic device 1100 may include a body 1110, a micro processor unit 1120, a power unit 1130, a function unit 1140, and a display controller unit 1150. The body 1110 may include a set board formed of a printed circuit board. The micro processor unit 1120, the power unit 1130, the function unit 1140, and/or the display controller unit 1150 may be mounted on the body 1110.

The power unit 1130 may be provided with a predetermined voltage from an external/internal battery (not shown) and then the predetermined voltage may be divided into desired voltage levels. The power unit 1130 may provide the desired voltage levels to the micro processor unit 1120, the function unit 1140, and the display controller unit 1150.

The micro processor unit 1120 may be provided with the power voltage(s) from the power unit 1130 and then control the function unit 1140 and a display unit 1160. The function unit 1140 may perform various functions of the electronic device 1100. For example, if the electronic device 1100 is a portable phone, the function unit 1140 may include various elements capable of performing portable phone-functions such as dialing, image output of the display unit 1160 by communication with an external apparatus 1170, and voice output of a speaker. If the electronic device 1100 includes a camera, the function unit 1140 may include a camera image processor. For example, if the electronic device 1100 is connected to a memory card to extend memory capacity, the function unit 1140 may be a memory card controller. The function unit 1140 may communicate with the external apparatus 1180 through a wired or wireless communication unit 1180. For example, if the electronic device 1100 demands a universal serial bus (USB) to extend functions, the function unit 1140 may include an interface controller. One or more of PoP devices 100 to 106 according to the above embodiments may be used as at least one of the micro processor unit 1120 and/or the function unit 1140.

Semiconductor package techniques described above may be applied to electronic systems.

Figure 17:
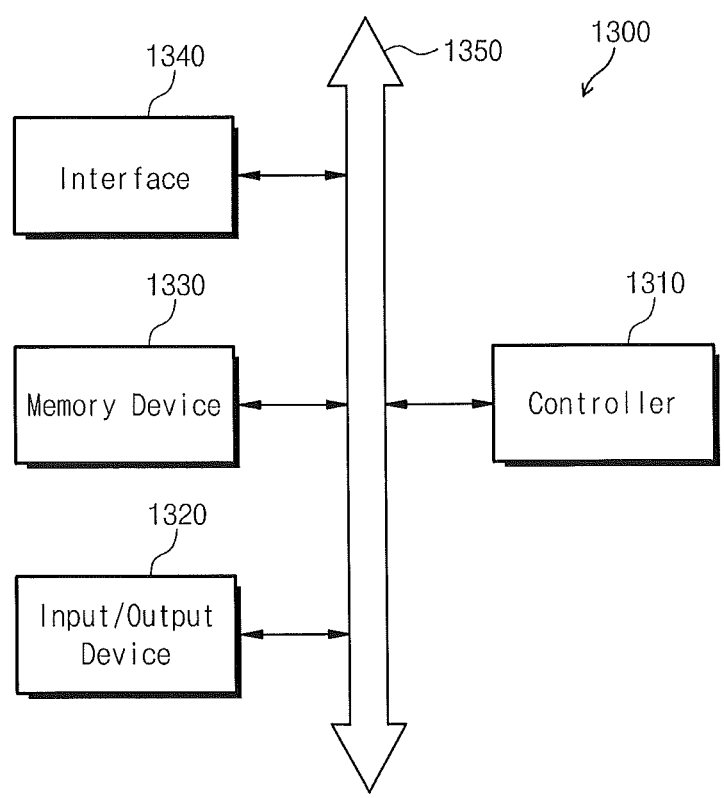
FIG. 17 is a block diagram illustrating an example of electronic systems including at least one semiconductor package according to embodiments of inventive concepts.

FIG. 17 is block diagram illustrating an example of electronic systems including at least one of semiconductor packages according to embodiments of inventive concepts.

Referring to FIG. 17, an electronic system 1300 may include a controller 1310, an input/output device 1320, and a memory device 1330. The controller 1310, the input/output device 1320, and the memory device 1330 may be combined/coupled with each other through a bus 1350. The bus 1350 may correspond to a path through which electrical signals are transmitted. For example, the controller 1310 may include at least one of a microprocessor, a digital signal processor, a microcontroller, and/or other logic devices. The other logic devices may have a similar function to any one of the microprocessor, the digital signal processor and/or the microcontroller. The controller 1310 and/or the memory device 1330 may include the PoP devices according to embodiments of inventive concepts. The input/output device 1320 may include a keypad, a keyboard and/or a display unit. The memory device 1330 may be a device storing data. The memory device 1330 may store data and/or commands executed by the controller 1310. The memory device 1330 may include a volatile memory device and/or a non-volatile memory device, or the memory device 1330 may include a flash memory. The flash memory may be realized as a solid state disk (SSD). In this case, the electronic system 1300 may stably store massive data in the memory device 1330. The electronic system 1300 may further include an interface 1340 that may transmit electrical data to a communication network or may receive electrical data from a communication network. The interface 1340 may operate using wireless or cable data couplings. For example, the interface unit 1340 may include an antenna for wireless communication or a transceiver for cable communication. Although not shown in the drawings, an application chipset and/or a camera image processor (CIS) may also be provided for the electronic system 1300.

In PoP devices according to embodiments of inventive concepts, the sealing layer may exist between the upper semiconductor package and the lower semiconductor package. Thus, a contact area of the upper and lower semiconductor packages may increase, so that a degree of warping of the PoP device may be reduced. Additionally, due to the sealing layer, the connecting solder bumps, the upper semiconductor package, and the lower semiconductor package may be protected from moisture, external contamination, and/or corrosion.

In embodiments where the sealing layer(s) surrounds sidewalls of connection solder bumps and contacts both upper and lower semiconductor packages, the sealing layer may protect connection solder bumps to reduce and/or prevent cracks in connection solder bumps. Use of sealing layers according to embodiments discussed herein may thus reduce and/or prevent joint cracks between upper and lower semiconductor packages.

Since the lower semiconductor chip is mounted on the lower package substrate using a flip chip bonding method, a length of an electric path may be reduced. Thus, a signal transmission speed may be improved.

In methods of fabricating the PoP device according to embodiments of inventive concepts, at least one of the lower solder bump and the upper solder bump may be coated with a sealing layer resin solution having flux function and then heated in a reflow operation. Thus, the connecting solder bump and the sealing layer may be formed relatively simply and rapidly.

While inventive concepts have been described with reference to example embodiments, it will be apparent to those skilled in the art that various changes and modifications may be made without departing from the spirit and scope of inventive concepts. Therefore, it should be understood that the above embodiments are not limiting, but illustrative. Thus, the scope of inventive concepts, is to be determined by the broadest permissible interpretation of the following claims and their equivalents, and shall not be restricted or limited by the foregoing description.

That which is claimed is:

1. A package-on-package (POP) electronic device comprising:
   first and second packaging substrates;
   a solder interconnection providing electrical and mechanical coupling between the first and second packaging substrates; and
   first and second sealing layers between the first and second packaging substrates; wherein the first sealing layer comprises a mold layer on the first packaging substrate having a via therethrough, wherein the solder interconnection extends through the via, and wherein portions of the second sealing layer are in the via between the mold layer and the solder interconnection.

2. The POP electronic device of claim 1 wherein the first and second sealing layers comprise respective first and second epoxy sealing layers.

3. The POP electronic device of claim 2 wherein the second epoxy sealing layer includes a solder flux agent, and wherein the first epoxy sealing layer has a lower concentration of the solder flux agent than the second epoxy sealing layer.

4. The POP electronic device of claim 1 wherein sidewalls of the via through the mold layer have a surface roughness that is greater than a surface roughness of a surface of the mold layer that is spaced apart from the first packaging substrate.

5. The POP electronic device of claim 1 wherein the first and second sealing layers are spaced apart between the first and second packaging substrates.

6. The POP electronic device of claim 1 further comprising:
a semiconductor integrated circuit (IC) device electrically and mechanically coupled to the first packaging substrate wherein the semiconductor IC device is between the first and second packaging substrates and wherein the semiconductor IC device is spaced apart from the solder interconnection.

7. The POP electronic device of claim 6 wherein the semiconductor IC device comprises a first semiconductor IC device, the POP electronic device further comprising:
a second semiconductor IC device electrically and mechanically coupled to the second packaging substrate wherein the second packaging substrate is between the second semiconductor IC device and the first packaging substrate; a mold layer between the first and second packaging substrates wherein the mold layer includes a via therethrough, wherein the solder interconnection extends through the via between the first and second packaging substrates, and wherein portions of the sealing layer are in the via between the mold layer and the solder interconnection.

8. The POP electronic device of claim 7 further comprising:
a plurality of solder bumps between the second semiconductor IC device and the second packaging substrate wherein the plurality of solder bumps provide electrical and mechanical coupling between the second semiconductor IC device and the second packaging substrate.

9. The POP electronic device of claim 7 further comprising:
a third semiconductor IC device electrically coupled to the second packaging substrate, wherein the third semiconductor IC device is on the second semiconductor IC device with the second semiconductor IC device between the third semiconductor IC device and the second packaging substrate.

10. The POP electronic device of claim 1 wherein the first packaging substrate has first and second surfaces, wherein the first surface is between the second surface and the second packaging substrate, the POP electronic device further comprising:
a plurality of solder bumps on the second surface of the first packaging substrate, wherein an electrical coupling is provided through the first packaging substrate between the solder interconnection and at least one of the plurality of solder bumps.

11. A package-on-package (POP) electronic device comprising:
a first packaging substrate;
a semiconductor integrated circuit (IC) device electrically and mechanically coupled to the first packaging substrate;
a second packaging substrate on the first packaging substrate with the semiconductor IC device between the first and second packaging substrates;
a solder interconnection providing electrical and mechanical coupling between the first and second packaging substrates with the solder interconnection being spaced apart from the semiconductor IC device;
a sealing layer on the solder interconnection between the first and second packaging substrates; and
a mold layer between the first and second packaging substrates wherein the mold layer includes a via therethrough, wherein the solder interconnection extends through the via between the first and second packaging substrates, and wherein portions of the sealing layer are in the via between the mold layer and the solder interconnection.

12. The POP electronic device of claim 11 wherein the solder interconnection comprises a first solder interconnection, the device further comprising:
a second solder interconnection providing electrical and mechanical coupling between the first and second packaging substrates with the second solder interconnection being spaced apart from the first solder interconnection and being spaced apart from the semiconductor IC device.

13. The POP electronic device of claim 12 wherein the sealing layer comprises a first sealing layer, the device further comprising:
a second sealing layer on the second solder interconnection between the first and second packaging substrates wherein the first and second sealing layers are spaced apart between the first and second solder interconnection structures.

14. The POP electronic device of claim 12 wherein the sealing layer comprises a continuous sealing layer on the first and second solder interconnection structures between the first and second packaging substrates.

15. The POP electronic device of claim 11 further comprising:
a plurality of solder bumps providing electrical and mechanical coupling between the semiconductor IC device and the first packaging substrate; and
an underfill material on the plurality of solder bumps between the first semiconductor IC device and the first packaging substrate.

16. The POP electronic device of claim 11 wherein portions of the sealing layer are between the mold layer and the second packaging substrate.

17. The POP electronic device of claim 11 wherein a surface of the semiconductor IC device adjacent the second packaging substrate is free of the mold layer.

18. The POP electronic device of claim 11 wherein sidewalls of the via through the mold layer have a surface roughness that is greater than a surface roughness of a surface of the mold layer that is spaced apart from the first packaging substrate.

* * * * *